(12) United States Patent
Tang

(10) Patent No.: US 9,265,181 B2
(45) Date of Patent: Feb. 16, 2016

(54) HEAT DISSIPATION APPARATUS AND ELECTRONIC DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Xian-Xiu Tang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 313 days.

(21) Appl. No.: 13/918,999

(22) Filed: Jun. 17, 2013

(65) Prior Publication Data

US 2014/0328021 A1 Nov. 6, 2014

(30) Foreign Application Priority Data

May 6, 2013 (CN) .......................... 2013 1 01615672

(51) Int. Cl.
*H05K 7/20* (2006.01)
(52) U.S. Cl.
CPC ........ *H05K 7/20781* (2013.01); *H05K 7/20263* (2013.01)

(58) Field of Classification Search
CPC .......... H05K 7/20263; H05K 7/20272; H05K 7/20327; H05K 7/20627; H05K 7/20781
USPC ............... 361/679.46, 679.53, 699, 716, 725, 361/726, 798, 801
See application file for complete search history.

(56) References Cited

U.S. PATENT DOCUMENTS

| | | | |
|---|---|---|---|
| 6,166,907 A * | 12/2000 | Chien | 361/699 |
| 7,602,612 B2 * | 10/2009 | Li | 361/747 |
| 2011/0192572 A1 * | 8/2011 | Tsai | 165/104.19 |

* cited by examiner

*Primary Examiner* — Tuan T Dinh
*Assistant Examiner* — Mukund G Patel
(74) *Attorney, Agent, or Firm* — Novak Druce Connolly Bove + Quigg LLP

(57) ABSTRACT

An electronic device includes a chassis and a heat dissipation apparatus. The chassis includes a sidewall defining a latching hole and a rear wall defining an opening adjacent to the latching hole. The heat dissipation apparatus is detachably inserted in the chassis from the opening. The heat dissipation apparatus includes a casing defining a positioning slot aligning with the latching hole of the chassis, a liquid cooling assembly received in the casing, and a resilient latching member. A first end of the latching member is mounted in the casing. A latching block protrudes out from a second end of the latching member. The latching block extends through the positioning slot, to be latched in the latching hole of the chassis.

15 Claims, 6 Drawing Sheets

HEAT DISSIPATION APPARATUS AND ELECTRONIC DEVICE USING THE SAME

BACKGROUND

1. Technical Field

The present disclosure relates to an electronic device with a heat dissipation apparatus.

2. Description of Related Art

In an electronic device, such as a computer or a server, some modules, such as liquid cooling apparatus, are usually mounted in a chassis of the electronic device by screws. However, it is time-consuming and often difficult to disassemble those modules from the electronic device when they need to be replaced.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
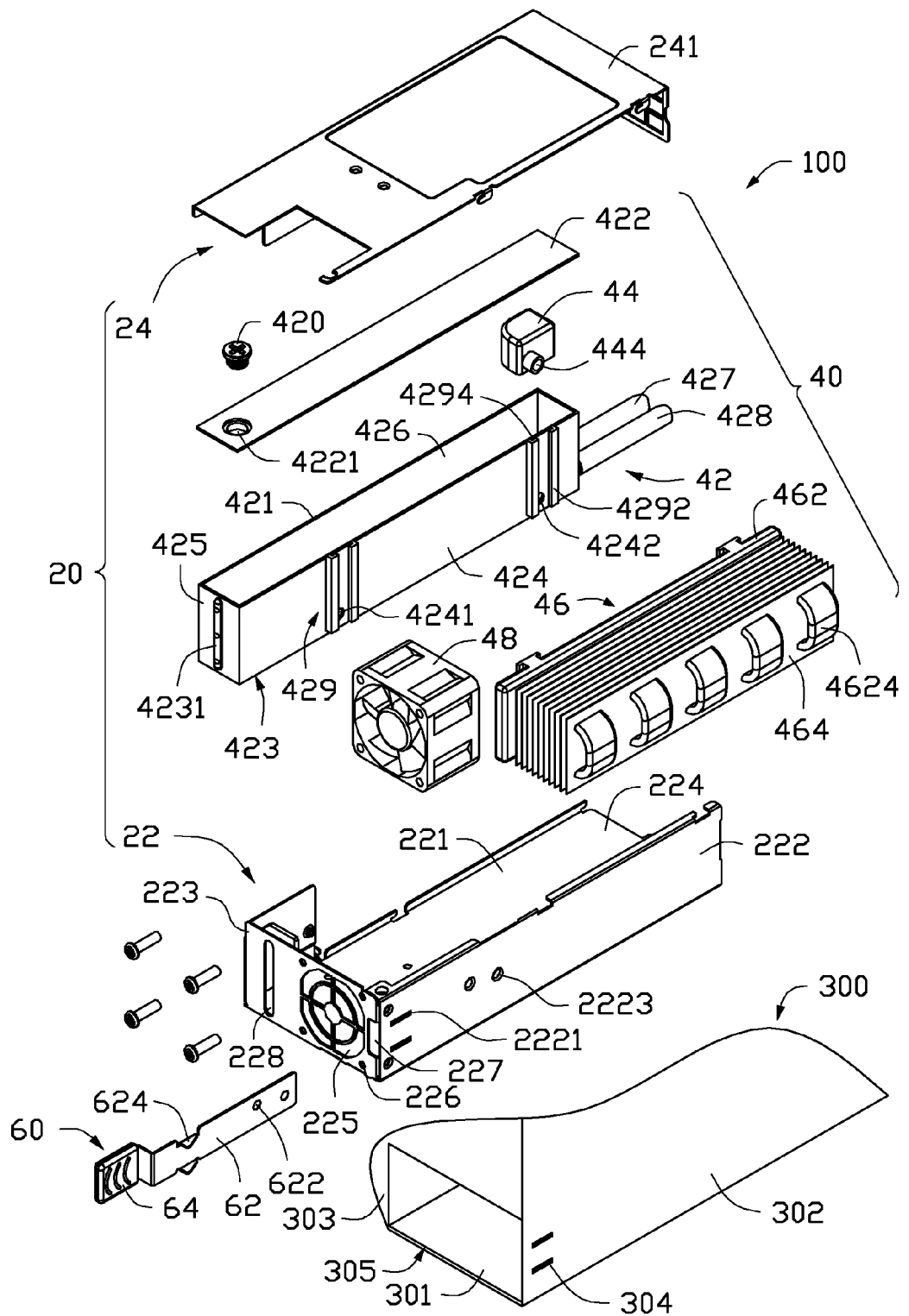
FIG. 1 is an isometric, exploded view of an embodiment of an electronic device, wherein the electronic device includes a heat dissipation apparatus.
Figure 2:
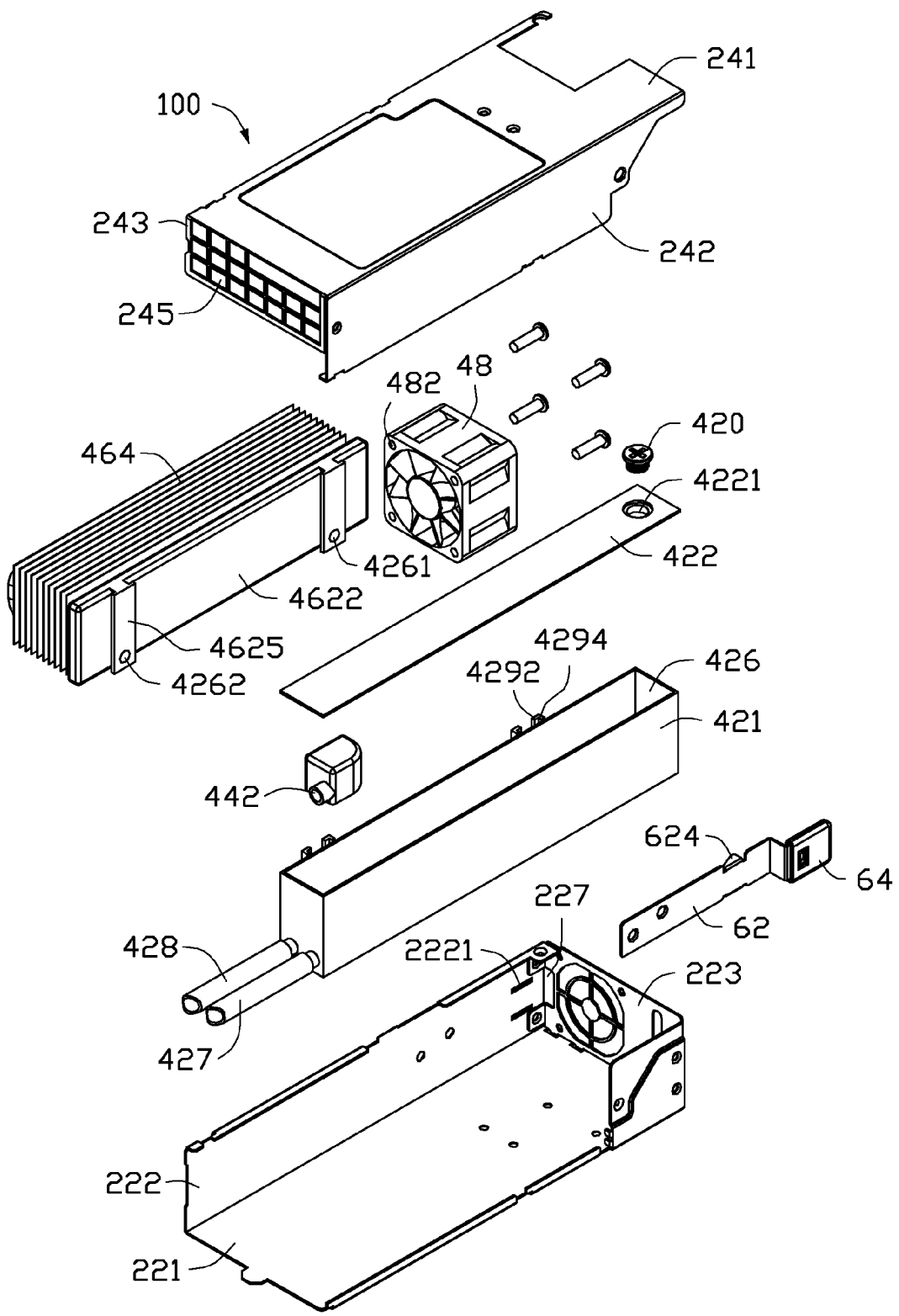
FIG. 2 is similar to FIG. 1, but only shows the heat dissipation apparatus from another perspective.
Figure 6:
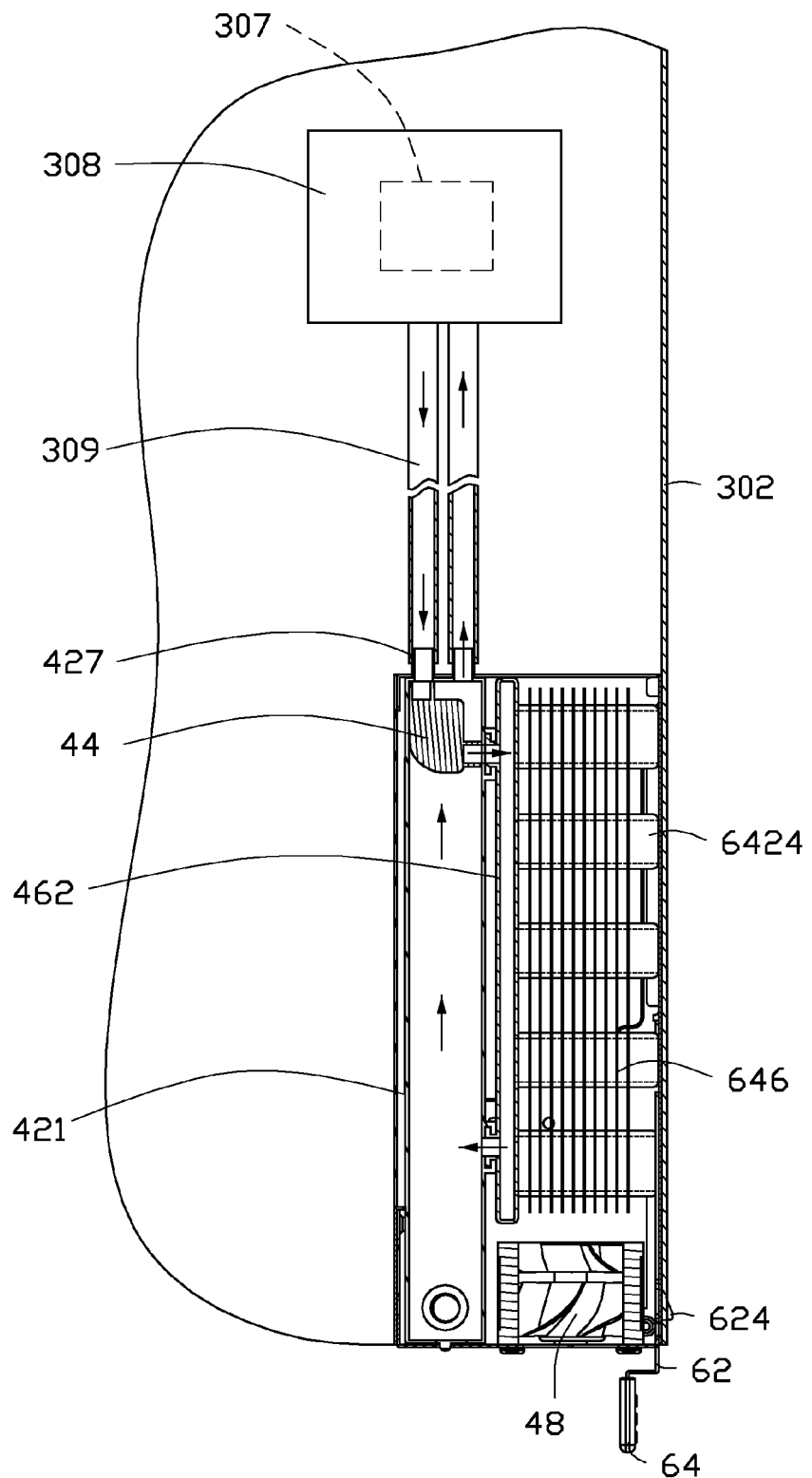
FIG. 6 is a cross-sectional view of FIG. 5, taken along the line of VI-VI.

FIGS. 1, 2, and 6 show an embodiment of an electronic device including a chassis 300 and a heat dissipation apparatus 100. A plurality of electronic components 307 is installed in the chassis 300, a heat absorbing box 308 is engaged on the electronic component 307, and two water pipes 309 communicate with an inner space of the heat absorbing box 308. The chassis 300 defines a receiving space 301, and includes a sidewall 302 defining two latching holes 304 in a rear end of the sidewall 302 and communicating with the receiving space 301, and a rear wall 303 perpendicularly extending from the rear end of the sidewall 302. The rear wall 303 defines an opening 305 adjacent to the latching holes 304 and functioning as an access to the receiving space 301. The heat dissipation apparatus 100 includes a casing 20, a liquid cooling assembly 40, and a resilient latching member 60. In the embodiment, the chassis 300 is a server enclosure.

The casing 20 includes a base 22 and a cover 24.

The base 22 includes a rectangular bottom plate 221, a first side plate 222 perpendicularly extending up from a side of the bottom plate 221, and a rear plate 223 perpendicularly extending up from a rear end of the bottom plate 221 and perpendicularly connected to a rear end of the first side plate 222. The bottom plate 221, the first side plate 222, and the rear plate 223 cooperatively bound a receiving space 224. The rear plate 223 defines an air ventilation area 225, four through holes 226 surrounding the air ventilation area 225, an operation hole 227, and a through slot 228. The through slot 228 is defined in a first end of the rear plate 223 away from the first side plate 222, and extends along a direction perpendicular to the bottom plate 221. The operation hole 227 is defined in a second end of the rear plate 223 adjacent to the first side plate 222. The air ventilation area 225 is located between the through slot 228 and the operation hole 227. The rear end of the first side plate 222 defines two positioning slots 2221 adjacent to the operation hole 227 and extending along a direction perpendicular to the rear plate 223, and two mounting holes 2223 in front of the positioning slots 2221.

The cover 24 includes a rectangular top plate 241, a second side plate 242 perpendicularly extending down from a side of the top plate 241, and a front plate 243 perpendicularly extending down from a front end of the top plate 241 and perpendicularly connected to a front end of the second side plate 242. The front plate 243 defines a plurality of vents 245.

The liquid cooling assembly 40 includes a water tank 42, a water pump 44, a heat sink 46, and a fan 48.

The water tank 42 includes a rectangular receiving shell 421, a rectangular cover 422, and a plug 420. The receiving shell 421 includes a rectangular bottom plate 423, two side walls 424 perpendicularly extending up from two opposite sides of the bottom plate 423, and two end walls 425 perpendicularly extending up from two opposite ends of the bottom plate 423 and perpendicularly connected between the side walls 424. The bottom plate 423, the side walls 424, and the end walls 425 cooperatively bound a receiving slot 426. A bar-shaped indicator 4231 is installed on an outer surface of one end wall 425, and a lengthwise direction of the indicator 4231 is perpendicular to the bottom plate 423. An inlet pipe 427 and an outlet pipe 428 protrude forward from the other end wall 425 opposite to the indicator 4231, and communicate with the receiving slot 426. Two spaced connecting portions 429 protrude out from one of the side walls 424. Each connecting portion 429 includes two L-shaped connecting bars 4292 perpendicular to the bottom plate 423. Each connecting bar 4292 of each connecting portion 429 extends out from the side wall 424 and then toward the other connecting bar 4292. Thereby, the connecting bars 4292 of each connecting portion 429 and the side wall 424 cooperatively bound a latching slot 4294 extending along a direction perpendicular to the bottom plate 423. A bottom side of the side wall 424 with the connecting portions 429 defines an inlet hole 4241 in the latching slot 4294 adjacent to the indicator 423 and an outlet hole 4242 in the latching slot 4294 adjacent to the inlet pipe 427. An end of the cover 422 defines an opening 4221. In the embodiment, the plug 420 is a screw.

The water pump 44 can be received in the receiving slot 426 of the water tank 42, and includes a water inlet pipe 442 and a water outlet pipe 444.

The heat sink 46 includes a heat absorbing shell 462 and a plurality of fins 464. The heat absorbing shell 462 includes a rectangular and hollow box 4622, a plurality of U-shaped heat dissipation pipes 4624 extending out from a first side of the box 4622 and communicating with an inner space of the box 4622 with two ends, and two T-shaped latching blocks 4625 extending out from two opposite ends of a second side of the box 4622 opposite to the heat dissipation pipes 4624. Each latching block 4625 extends along a direction perpendicular to a lengthwise direction of the box 4622. The fins 464 are mounted to the heat dissipation pipes 4624. The fins 464 are parallel to the first side of the box 4622, and every two adjacent fins 464 are spaced from each other. A bottom end of one latching block 4625 defines an outlet hole 4261 and a bottom end of the other latching block 4625 defines an inlet hole 4262. The outlet hole 4261 and the inlet hole 462 communicate with the inner space of the box 4622. The heat dissipation pipes 4624 and the box 4622 are made of heat-conductive material.

Each fan 48 is rectangular, and defines four screw holes 482 in four corners of the fan 48.

The latching member 60 includes a resilient latching plate 62 and a substantially L-shaped operation plate 64 perpendicularly extending in and then rearward from a rear end of the latching plate 62. A front end of the latching plate 62 defines two positioning holes 622. Two wedge-shaped latching blocks 624 perpendicularly extend out from a top side and a bottom side of the rear end of the latching plate 62. In the embodiment, the latching member 60 is made of resilient material.

Figure 3:
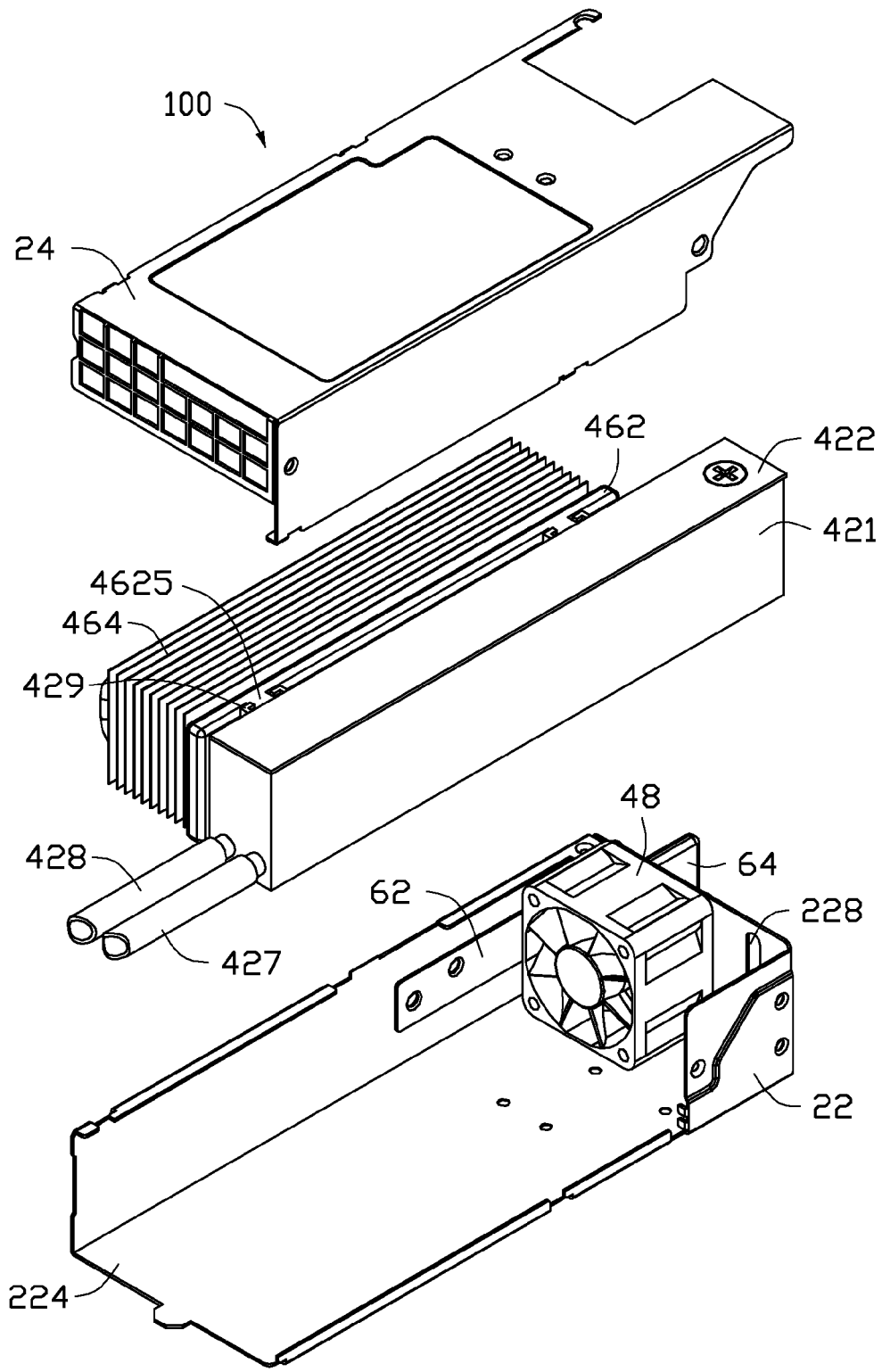
FIG. 3 is a partially assembled, isometric view of FIG. 2.
Figure 4:
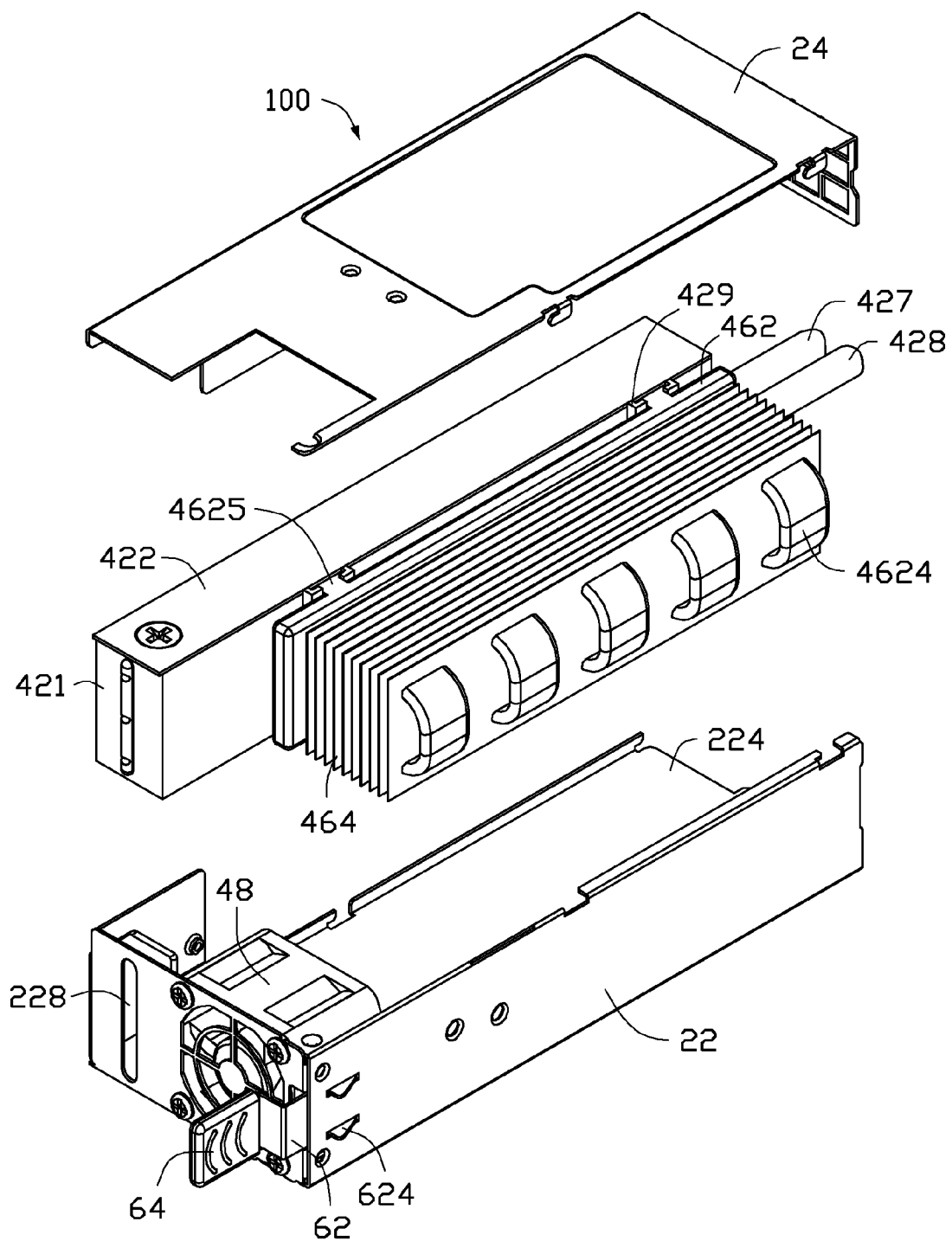
FIG. 4 is a partially assembled, isometric view of FIG. 1.
Figure 5:
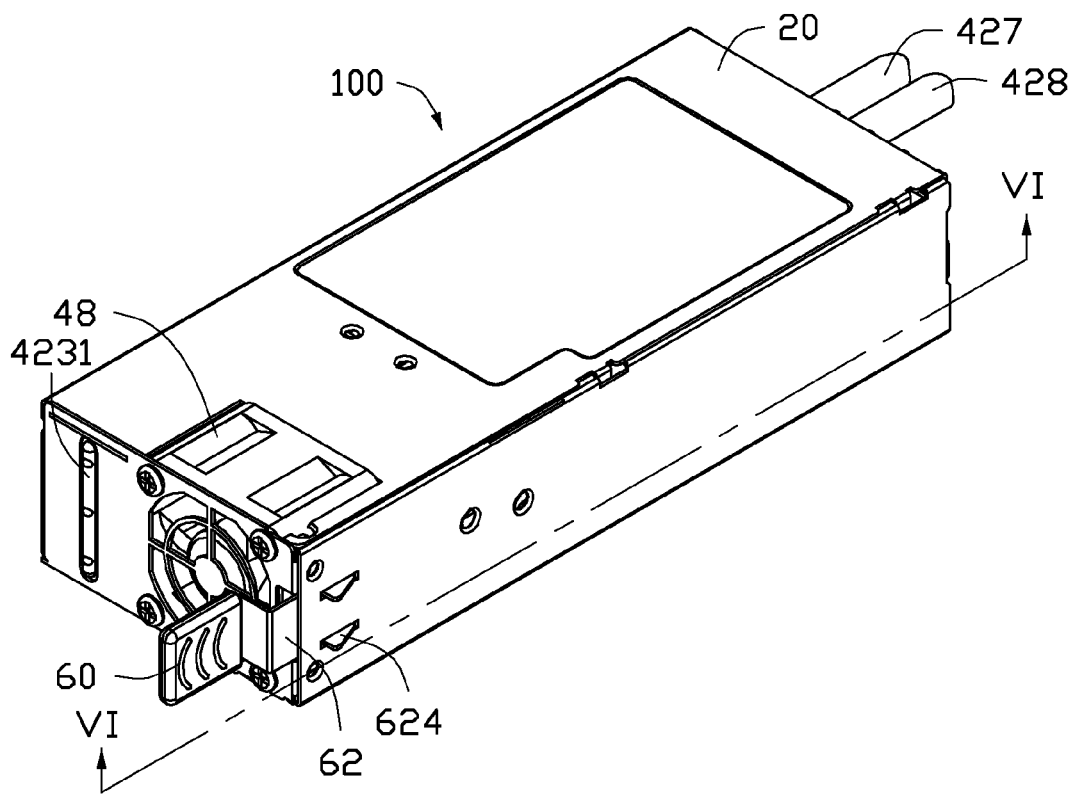
FIG. 5 is an assembled, isometric view of the electronic device of FIG. 4.

FIGS. 3-5 show that in assembling the heat dissipation apparatus 100, the front end of the latching member 60 is inserted into the base 22 through the operation hole 227. Two rivets extend through the positioning holes 622 of the latching member 60, to be fastened into the corresponding mounting holes 2223 of the base 22. Thereby the front end of the latching member 60 is mounted on an inner surface of the first side plate 222. The operation plate 64 extends out of the rear plate 223, and the latching blocks 624 extend through the corresponding positioning slots 2221. The fan 48 is placed in the receiving space 224 of the base 22, aligning with the air ventilation area 225. Screws extend through the through holes 226 of the rear plate 223, to be screwed into the screw holes 482 of the fan 48. The latching blocks 4625 of the heat sink 46 are inserted into the latching slots 4294 of the water tank 42, to allow the inlet hole 4262 of the heat sink 46 to align with the outlet hole 4242 of the water tank 42, and allow the outlet hole 4261 of the heat sink 46 to align with the inlet hole 4241 of the water tank 42. The water pump 44 is received in the receiving slot 426 of the water tank 42, to allow the water inlet pipe 442 to be connected to the inlet pipe 427 of the water tank 42, and allow the water outlet pipe 444 to extend through the outlet hole 4242 of the water tank 42 and insert into the inlet hole 4262 of the heat sink 46. The cover 422 is mounted on the water tank 42, and the plug 420 is installed into the opening 4221 of the cover 422. A combination of the water tank 42, the water pump 44, and the heat sink 46 is placed in the receiving space 224 of the base 22, with the fins 464 of the heat sink 46 aligning with the fan 48 and the indicator 4231 received in the through slot 228 of the base 22. The cover 24 is covered on the base 22.

FIG. 6 shows that in assembly of the heat dissipation apparatus 100 to the chassis 300. The casing 20 is inserted into the receiving space 301 through the opening 305. The latching blocks 624 slidably abut against an inner surface of the sidewall 302, deforming the latching plate 62 in to withdraw in the positioning slots 2221 of the base 22, until the latching blocks 624 align with the latching holes 304 of the chassis 300. The latching plate 62 then is restored to engage the latching blocks 624 in the latching holes 304 of the chassis 300. Thereby, the heat dissipation apparatus 20 is installed in the chassis 300.

In use, the water pipes 309 are respectively connected to the inlet pipes 427 and the outlet pipes 428. The plug 420 is removed from the cover 422, the water is poured in the receiving slot 426 of the water tank 42 from the opening 4221, and the indicator 4231 shows the amount of the water. The electronic component 307 operates to generate a lot of heat. The heat is transferred to the water in the heat absorbing box 308. The water pump 44 pump the heated water of the heat absorbing box 308 into the heat absorbing shell 462 through one of the water pipes 309, the inlet pipe 427, the water inlet pipe 442, and the water outlet pipe 444. The heat of the heated water in the heat absorbing shell 462 is transferred to the fins 464, and the fan 48 dissipates the heat from the fins 464. Therefore, the heated water is cooled. The cooled water is then transferred back into the water tank 42 through the outlet hole 4261 of the heat absorbing shell 462, and the inlet hole 4241 of the water tank 42. The cooled water flows along the outlet pipe 428, and the other water pipe 309, to enter the heat absorbing box 308, to absorb heat of the electronic component 307. Therefore, the heat dissipation apparatus 100 continually dissipates heat from the electronic component 307.

When disassembling the heat dissipation apparatus 100, the operation plate 64 is manipulated away from the first side plate 222, thereby deforming the latching plate 62 and disengaging the latching blocks 624 from the latching holes 304 of the chassis 300. The operation plate 64 is pulled out, and thereby the heat dissipation apparatus 100 may be easily separated from the chassis 300.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A heat dissipation apparatus for being detachably inserted into a chassis, the heat dissipation apparatus comprising:
    a casing defining a positioning slot;
    a liquid cooling assembly received in the casing and comprising a water tank and a heat sink secured to a side of the water tank; and
    a resilient latching member comprising a first end mounted to an inner surface of the casing, and a second end opposite to the first end, a latching block protruding outwards from the second end of the latching member;
    wherein the latching block extends through the positioning slot, to be latched to the chassis; the water tank comprises a side wall and two spaced connecting portions protruding out from two opposite ends of the side wall, and each connecting portion defines a latching slot; the heat sink comprises a hollow box and two box latching blocks extending out from two opposite ends of the box; and the box latching blocks are latched into the latching slots.

2. The heat dissipation apparatus of claim 1, wherein the casing comprises a base and a cover covered on the base, the base comprises a bottom plate, a first side plate extending up from a side of the bottom plate, and a rear plate extending up from a rear end of the bottom plate and connected to the first side plate, the bottom plate, the first side plate, and the rear plate cooperatively bound a receiving space, the positioning slot is defined in the first side plate adjacent to the rear plate, the rear plate defines an operation hole adjacent to the positioning slot, the latching member is moveably received in the operation hole.

3. The heat dissipation apparatus of claim 2, wherein the latching member comprises a resilient latching plate and an operation plate extending rearward from a rear end of the latching plate, a front end of the latching plate is mounted to the inner surface of the first side plate of the base, the operation plate extends out of the base through the operation hole, the latching block perpendicularly extends out from the rear end of the latching plate, and extends through the positioning slot of the first side plate.

4. The heat dissipation apparatus of claim 2, wherein the liquid cooling assembly further comprises a water pump received in the water tank and a fan aligning with the heat sink, the heat sink comprises a plurality of heat dissipation pipes extending out from a first side of the box opposite to the water tank, and a plurality of fins mounted to the plurality of heat dissipation pipes, the plurality of heat dissipating pipes communicates with an inner space of the box.

5. The heat dissipation apparatus of claim 4, wherein two opposite ends of a second side of the box opposite to the plurality of heat dissipation pipes defines a first inlet hole and a first outlet hole, the side of the water tank defines a second inlet hole communicating with the first outlet hole, and a second outlet hole communicating with the first inlet hole, an inlet pipe and an outlet pipe protrude forward from a front end of the water tank, and communicating with an inner space of the water tank, the water pump comprises a water inlet pipe connected to the inlet pipe, and a water outlet pipe extending through the second outlet hole of the water tank and the first inlet hole of the box to communicate with the inner space of the box.

6. The heat dissipation apparatus of claim 5, wherein the water tank further comprises two opposite end walls connected to two ends of the side wall, the heat sink is mounted to an outer surface of the side wall, the second inlet hole and the second outlet hole are defined in the side wall.

7. The heat dissipation apparatus of claim 5, wherein each connecting portion comprises two L-shaped connecting bars, each connecting bar of each connecting portion extends out from the side wall and then toward the other connecting bar of the connecting portion, each latching slot is bounded by the corresponding connecting bars, each latching block is T-shaped, the first inlet hole and the first outlet hole are defined in bottom ends of the connecting bars, the second inlet hole and the second outlet hole are located between the corresponding connecting bars.

8. The heat dissipation apparatus of claim 6, wherein the rear plate of the base defines a through slot, an indicator is mounted on the end wall and received in the through slot.

9. The heat dissipation apparatus of claim 4, wherein the rear plate of the base defines an air ventilation area, the fan is mounted to an inner surface of the rear plate, between the air ventilation area and the plurality of fins.

10. An electronic device, comprising:
a chassis comprising a first sidewall defining a latching hole and a rear wall defining an opening adjacent to the latching hole; and
a heat dissipation apparatus detachably inserted in the chassis through the opening, and comprising a casing defining a positioning slot aligning with the latching hole of the chassis, a liquid cooling assembly received in the casing, and a resilient latching member; wherein the latching member comprises a first end mounted to an inner surface of the casing, and a second end opposite to the first end, a latching block protrudes out from the second end of the latching member, and extends through the positioning slot of the casing, to latch in the latching hole of the chassis;
wherein the casing comprises a base and a cover covered on the base, the base comprises a bottom plate, a first side plate extending up from a side of the bottom plate, and a rear plate extending up from a rear end of the bottom plate and connected to the first side plate, the bottom plate, the first side plate, and the rear plate cooperatively bound a receiving space, the positioning slot is defined in the first side plate adjacent to the rear plate, the rear plate defines an operation hole adjacent to the positioning slot, the latching member is moveably received in the operation hole;
wherein the liquid cooling assembly comprises a water tank received in the receiving space of the base, a water pump received in the water tank, a heat sink installed to a side of the water tank, and a fan aligning with the heat sink, the heat sink comprises a hollow box, a plurality of heat dissipation pipes extending out from a first side of the box opposite to the water tank, and a plurality of fins mounted to the plurality of heat dissipation pipes, the plurality of heat dissipating pipes communicates with an inner space of the box; and
the chassis further comprises an electronic component, a heat absorbing box mounted on the electronic component, a first water pipe communicating with the heat absorbing box, and a second water pipe communicating with the heat absorbing box, two opposite ends of a second side of the box opposite to the plurality of heat dissipation pipes defines a first inlet hole and a first outlet hole, the side of the water tank defines a second inlet hole communicating with the first outlet hole, and a second outlet hole communicating with the first inlet hole, an inlet pipe connecting to the first water pipe and an outlet pipe connecting to the second water pipe protrude forward from a front end of the water tank, and communicating with an inner space of the water tank, the water pump comprises a water inlet pipe connected to the inlet pipe, and a water outlet pipe extending through the second outlet hole of the water tank and the first inlet hole of the box.

11. The electronic device of claim 10, wherein the latching member comprises a resilient latching plate and an operation plate extending rearward from a rear end of the latching plate, a front end of the latching plate is mounted to the inner surface of the first side plate of the base, the operation plate extends out of the base through the operation hole, the latching block perpendicularly extends out from the rear end of the latching plate, and extends through the positioning slot of the first side plate.

12. The electronic device of claim 10, wherein the rear plate of the base defines an air ventilation area, the fan is mounted to an inner surface of the rear plate, between the air ventilation area and the plurality of fins.

13. An electronic device, comprising:
a chassis defining a first receiving space, and comprising a sidewall, and a rear wall connected to a rear end of the sidewall to bound the first receiving space with the sidewall; the first receiving space comprising an access in the rear wall;
an electronic component received in the chassis;
a heat absorbing box contacting a top of the electronic component, and receiving water;
a casing detachably received in the first receiving space of the chassis through the access, and defining a second receiving space;
a water tank received in the second receiving space and comprising a side wall and two spaced connecting portions protruding out from two opposite ends of the side wall, and each connecting portion defines a latching slot and a receiving slot to receive water;
a water pipe connected between the water tank and the heat absorbing box;
a heat sink received in the second receiving space and secured to a side of the water tank; and comprising a hollow heat absorbing shell, a plurality of fins mounted to the heat absorbing shell, a hollow box, and two box latching blocks extending out from two opposite ends of the box and being latched into the latching slots, wherein the receiving slot of the water tank communicates with an inner space of the heat absorbing shell;

a water pump connected between the heat absorbing shell and the heat absorbing box; and a fan received in the second receiving space and aligning with the plurality of fins;

wherein the electronic component generates heat using operation, the water in the heat absorbing box absorbs the heat, the water pump pumps heated water from the heat absorbing box into the heat absorbing shell, the plurality of fins absorbs heat from the heated water, the fan cools the plurality of fins to cool the water in the heat absorbing shell, the cooled water enters the water tank firstly and the then enters the heat absorbing box to cool the electronic component.

14. The electronic device of claim 13, wherein the water pump is received in the receiving slot of the water tank.

15. The electronic device of claim 13, further comprising a resilient latching member, wherein the latching member comprises a first end fixed to the casing and a cantilevered second end, the sidewall of the chassis defining a latching hole communicating with the first receiving space, a latching block protrudes from the second end of the latching member to detachably engage in the latching hole.

\* \* \* \* \*